United States Patent
Noda et al.

(10) Patent No.: US 9,048,623 B2
(45) Date of Patent: Jun. 2, 2015

(54) PHOTONIC CRYSTAL LASER

(75) Inventors: Susumu Noda, Kyoto (JP); Kyoko Kitamura, Kyoto (JP); Yoshitaka Kurosaka, Hamamatsu (JP); Kyosuke Sakai, Sapporo (JP)

(73) Assignee: KYOTO UNIVERSITY, Kyoto (JP)

( * ) Notice: Subject to any disclaimer, the term of this patent is extended or adjusted under 35 U.S.C. 154(b) by 59 days.

(21) Appl. No.: 13/581,743

(22) PCT Filed: Mar. 1, 2011

(86) PCT No.: PCT/JP2011/054566
§ 371 (c)(1),
(2), (4) Date: Aug. 29, 2012

(87) PCT Pub. No.: WO2011/108510
PCT Pub. Date: Sep. 9, 2011

(65) Prior Publication Data
US 2013/0003768 A1    Jan. 3, 2013

(30) Foreign Application Priority Data

Mar. 1, 2010   (JP) ................................. 2010-044255

(51) Int. Cl.
*H01S 5/18* (2006.01)
*H01S 5/10* (2006.01)
(Continued)

(52) U.S. Cl.
CPC ................ *H01S 5/105* (2013.01); *H01S 5/187* (2013.01); *H01S 2301/14* (2013.01); *H01S 5/0267* (2013.01); *H01S 5/1071* (2013.01); *H01S 5/34333* (2013.01); *B82Y 20/00* (2013.01)

(58) Field of Classification Search
CPC ... H01S 5/105; H01S 5/18388; H01S 5/0267; H01S 2301/14

USPC ...................... 372/50.11, 50.23, 99
See application file for complete search history.

(56) References Cited

U.S. PATENT DOCUMENTS

2007/0075318 A1* 4/2007 Noda et al. ...................... 257/79
2007/0217466 A1* 9/2007 Noda et al. .................. 372/50.11
(Continued)

FOREIGN PATENT DOCUMENTS

CN         1765034 A      4/2006
EP       1 610 427 A1    12/2005
(Continued)

OTHER PUBLICATIONS

Quabis et al., "Focusing light to a tighter spot," *Optics Communications*, vol. 179, pp. 1-7, 2000.
(Continued)

*Primary Examiner* — Tod T Van Roy
(74) *Attorney, Agent, or Firm* — Oliff PLC

(57) ABSTRACT

A photonic crystal laser capable of producing a radially-polarized halo-shaped laser beam having a smaller width than conventional beams includes: an active layer; a ring-shaped photonic crystal including a plate-shaped base body on one side of the active layer, the base body having a number of modified refractive index areas of the same shape, the modified refractive index areas having a refractive index different from the base body and periodically arranged in the circumferential direction of a ring, and each of the modified refractive index areas being asymmetrically shaped with respect to an axis extending through the center of the modified refractive index area in the radial direction of the ring; a first and second electrode facing each other across the active layer and the ring-shaped photonic crystal; and a window provided in the second electrode capable of allowing passage of a laser light generated from the ring-shaped photonic crystal.

11 Claims, 10 Drawing Sheets

(51) Int. Cl.
   *B82Y 20/00*   (2011.01)
   *H01S 5/187*    (2006.01)
   *H01S 5/026*    (2006.01)
   *H01S 5/343*    (2006.01)

(56) References Cited

U.S. PATENT DOCUMENTS

2009/0034572 A1\* 2/2009 Ikuta ........................ 372/46.013
2009/0116527 A1   5/2009 Arimura
2010/0238966 A1\* 9/2010 Mochizuki ..................... 372/99

FOREIGN PATENT DOCUMENTS

| JP | A-2004-296538 | 10/2004 |
| JP | A-2007-258261 | 10/2007 |
| JP | A-2009-117578 | 5/2009 |
| KR | 10-2005-0111362 A | 11/2005 |
| WO | WO 2004/086575 A1 | 10/2004 |

OTHER PUBLICATIONS

Kitamura et al., "Sub-wavelength focal spot with long depth of focus generated by radially polarized, narrow-width annular beam," *Optics Express*, vol. 18, No. 5, pp. 4518-4525, Mar. 1, 2010.
"Z-Henkou Soshi (Z-Polarizing Element)", [online], 2005, Nanophoton Corporation, Searched Feb. 22, 2010, http://www.nanophoton.jp/products/zpol/index.html.
Kogelnik et al., "Coupled Wave Theory of Distributed Feedback Lasers," *Journal of Applied Physics*, vol. 43, No. 5, pp. 2327-2335, May 1972.
Written Opinion issued in Application No. PCT/JP2011/054566; Dated Apr. 19, 2011 (With Translation).
International Search Report issued in Application No. PCT/JP2011/054566; Dated Apr. 19, 2011.
Kitamura et al., "Photonic-Crystal Laser with Radially-Polarized Narrow Ring Beam Emission-Proposal of Device Structure and Investigation of Lasing Properties," *The Japan Society of Applied Physics and Related Societies*, Extended Abstracts, p. 04-040, Mar. 3, 2010.

\* cited by examiner

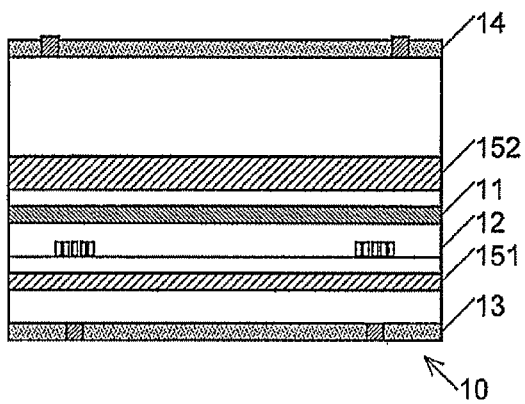
Fig. 1A
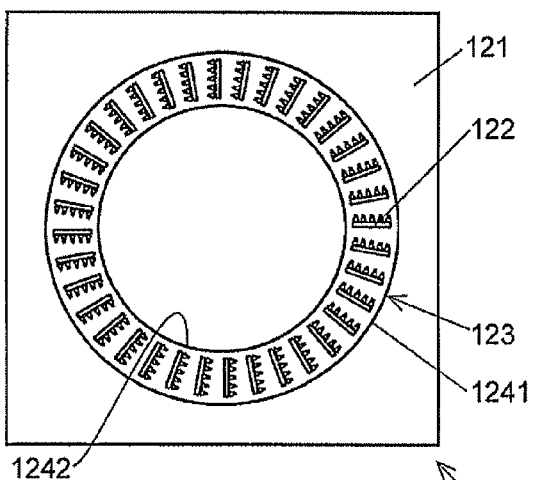
Fig. 1B
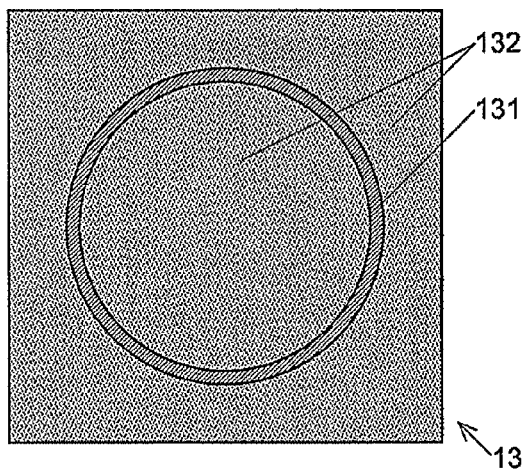
Fig. 1C
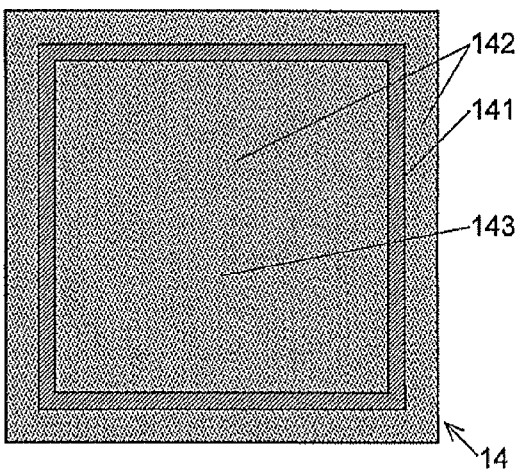
Fig. 1D
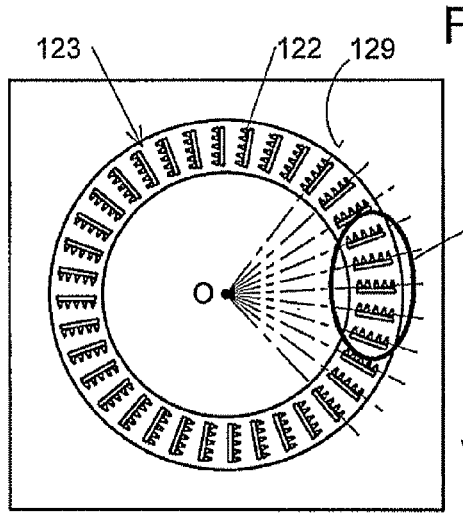
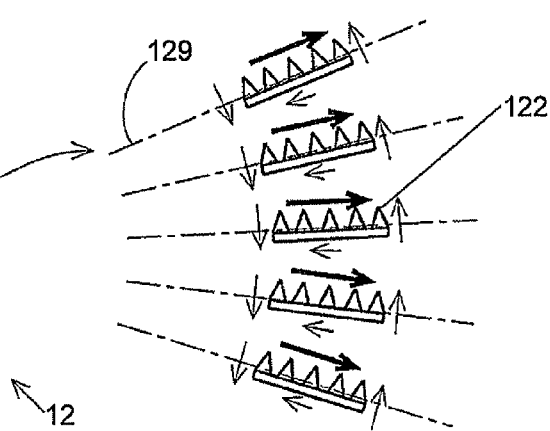
Fig. 2

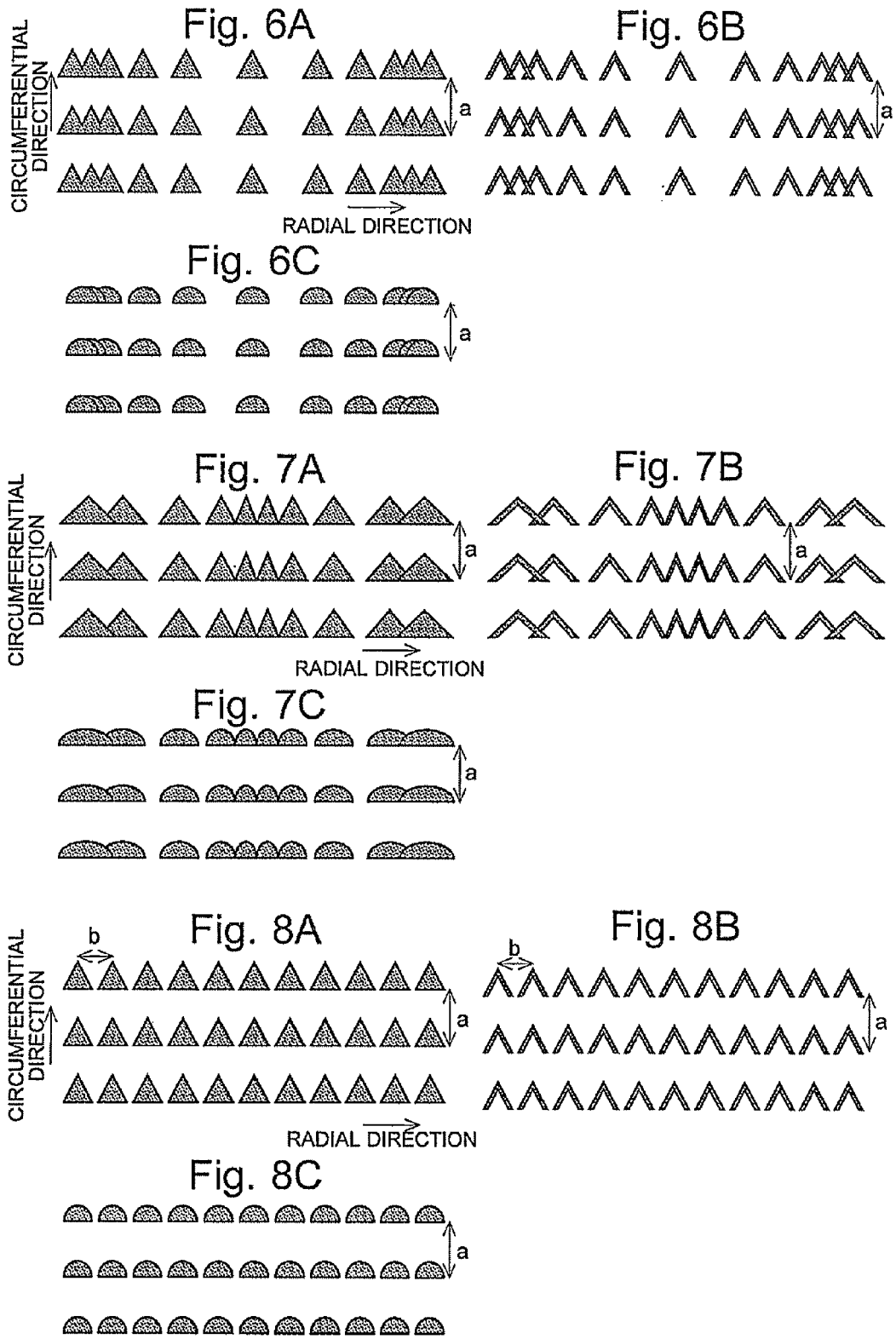

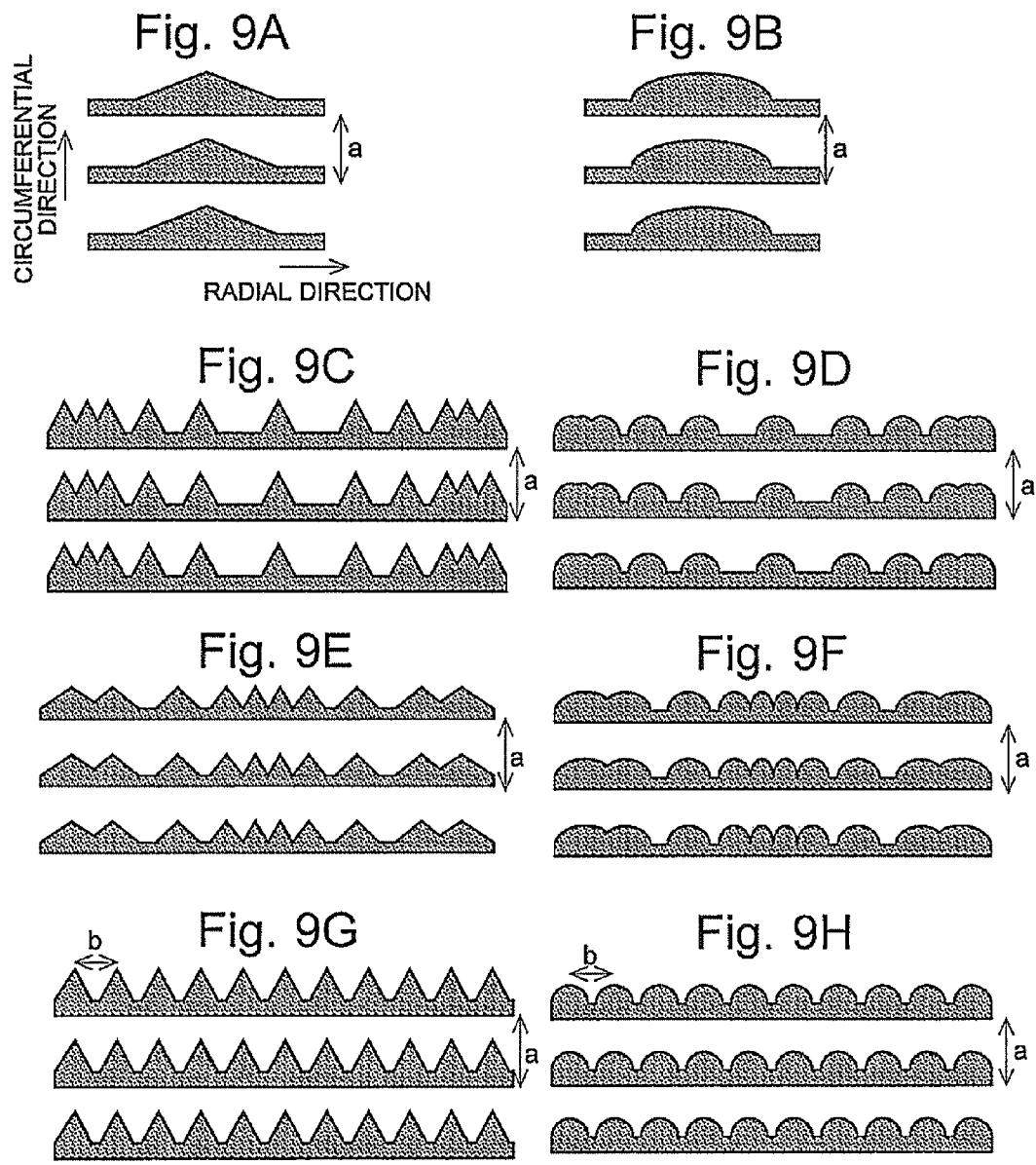

Fig. 12A
NEAR-FIELD IMAGE
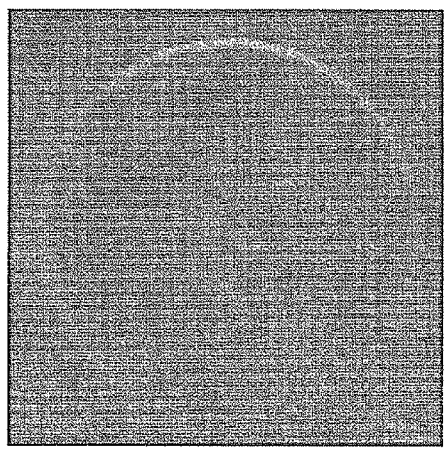
Fig. 12B
FAR-FIELD IMAGE
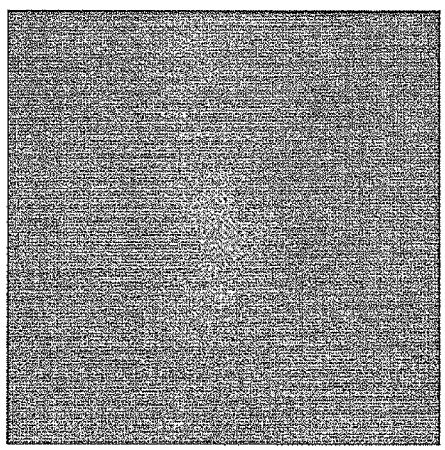
Fig. 13A ↔
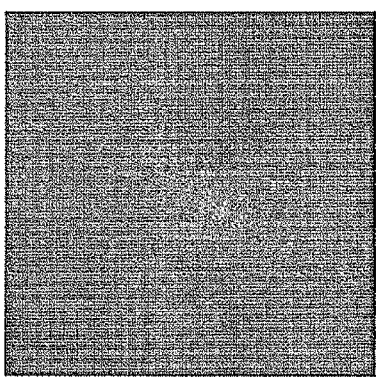
Fig. 13B ↘↖
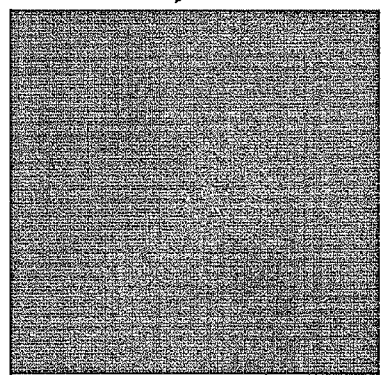
Fig. 13C ↕
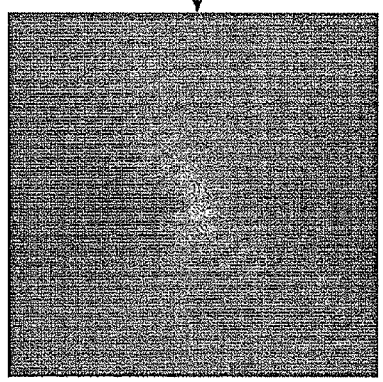
Fig. 13D ↘↖
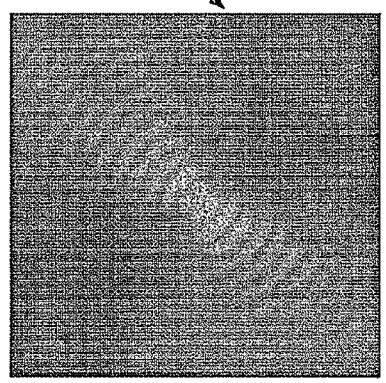

W = OUTER CIRCUMFERENTIAL WIDTH

WITHOUT SUB HOLE

WITH SUB HOLE, $\delta = a/4$

NOTE: FILLING FACTOR OF SUB HOLE=0.1.

Fig. 20
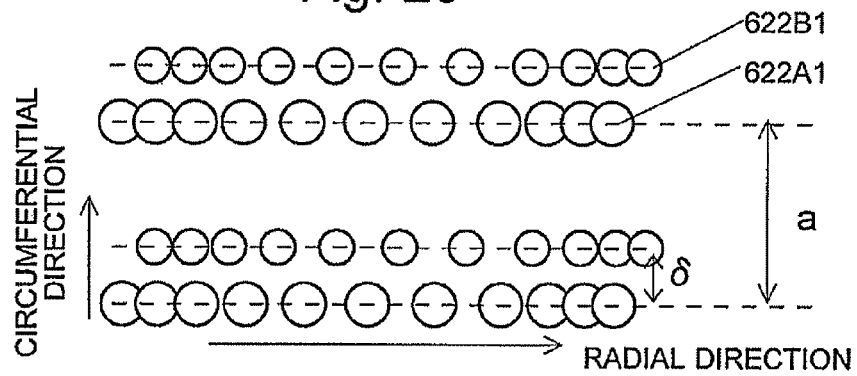
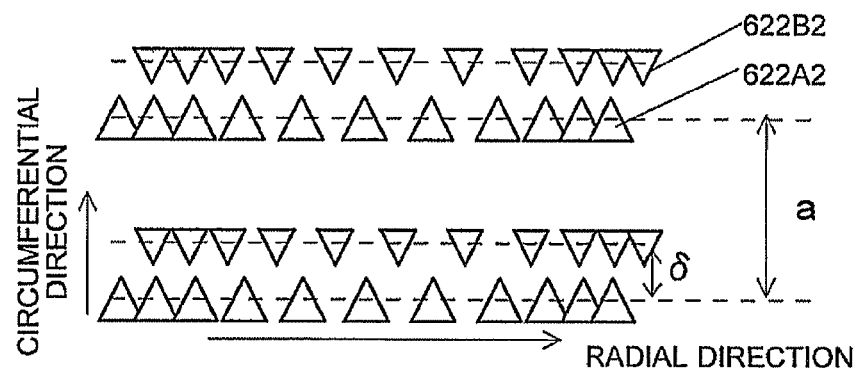
Fig. 21A
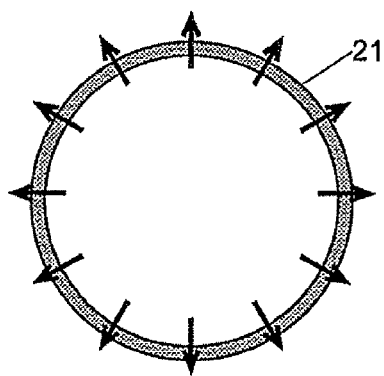
Fig. 21B
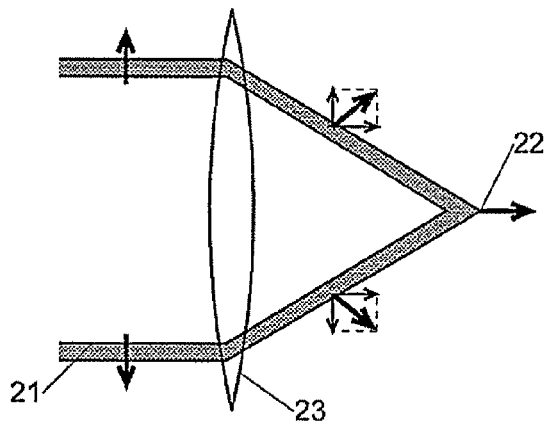

PHOTONIC CRYSTAL LASER

TECHNICAL FIELD

The present invention relates to a photonic crystal laser suitable as a light source for fluorescence microscopes, Raman spectrometers or similar devices.

BACKGROUND ART

The light source used in a fluorescence microscope, Raman spectrometer or similar optical measurement device is required to focus a laser beam into the smallest possible spot in order to improve the measurement accuracy. However, when the laser beam is simply focused by a focus lens, the spot size of the laser beam cannot be smaller than the diffraction limitation which is determined by the wavelength of the laser beam and the numerical aperture of the focus lens.

Non-Patent Document 1 discloses a laser beam suitable for reducing the spot size. FIG. 21A schematically shows a cross section of this laser beam at a plane perpendicular to the beam (this cross section hereinafter will be simply referred to as the "section of the laser beam"). The shaded portion in this figure corresponds to the area where the beam is present. The thick arrows in the figure indicate the polarizing direction. The laser beam has a ring-shaped cross section having no intensity in the central region and is polarized in the direction from its center toward the outer area (i.e. in the radial direction). A laser beam having such a cross-sectional shape and polarization is hereinafter referred to as the "radially-polarized ring-shaped laser beam." According to Non-Patent Document 1, the radially-polarized ring-shaped laser beam 21 can be focused into a laser beam whose spot size is smaller than the diffraction limitation. Conventionally, such a small spot could only be obtained over an extremely short range of up to approximately one wavelength in the direction of the optical axis. By using the new laser beam, it is possible to obtain a small spot over a range equal to or even longer than ten times the wavelengths (see Non-Patent Document 2).

As shown in FIG. 21B, when the radially-polarized ring-shaped laser beam 21 is focused by a lens 23, the electric-field components oscillating in the directions perpendicular to the laser beam (in the x and y directions) at the condensing point 22 are cancelled out, while the electric-field component oscillating in the direction parallel to the laser beam (in the z direction) remains without being cancelled out. As a result, at the condensing point 22, an oscillation of the electric field in the direction parallel to the travelling direction of the beam is created over a wide range of approximately ten times the wavelengths on the beam axis (see Non-Patent Document 2), Such a polarization (i.e. z-polarization) does not occur on the beam axis when a normal beam is used. Using the z-polarization is advantageous in some cases; for example, in a Raman scattering measurement, it is possible to observe a scattering that does not occur when a polarization perpendicular to the laser beam is used (see Non-Patent Document 3).

BACKGROUND ART DOCUMENT

Non-Patent Document

Non-Patent Document 1: S. Quabis et al., "Focusing light to a tighter spot", *Optics Communications*, vol. 179(2000), pp. 1-7
Non-Patent Document 2: K. Kitamura et al., *Optics Express*, vol. 18(2010), iss. 5, pp. 4518-4525
Non-Patent Document 3: "Z-Henkou Soshi (Z-Polarizing Element)", [online], 2005, Nanophoton Corporation, [Searched on Feb. 22, 2010], Internet
Non-Patent Document 4: H. Kogelnik et al., *Journal of Applied Physics*, vol. 43(1972), pp. 2327-2335

SUMMARY OF THE INVENTION

Problem to be Solved by the Invention

To further reduce the spot size of the laser beam, it is preferable to reduce the width of the ring in the radially-polarized ring-shaped laser beam. The problem to be solved by the present invention is to provide a photonic crystal laser capable of producing a radially-polarized halo-shaped laser beam having a smaller width than that of the conventional beam.

Means for Solving the Problems

A photonic crystal laser according to the present invention aimed at solving the aforementioned problem includes:
a) an active layer;
b) a ring-shaped photonic crystal including a plate-shaped base body on one side of the active layer, the base body having a number of modified refractive index areas of the same shape, the modified refractive index areas having a refractive index different from that of the base body and being periodically arranged in the circumferential direction of a ring, and each of the modified refractive index areas being asymmetrically shaped with respect to an axis extending through the center of the modified refractive index area in the radial direction of the ring;
c) a first electrode and a second electrode facing each other across the active layer and the ring-shaped photonic crystal; and
d) a window provided in the second electrode, the window being capable of allowing passage of a laser light generated from the ring-shaped photonic crystal.

In the photonic crystal laser according to the present invention, a voltage is applied between the first and second electrodes to inject electric current into the active layer, whereby light is generated within the active layer, and this light is introduced into the ring-shaped photonic crystal. Within the ring-shaped photonic crystal, a component of the introduced light having a specific wavelength corresponding to the cycle distance of the periodic structure of the ring-shaped photonic crystal is selectively amplified due to interference, causing laser oscillation. The laser light generated in the ring-shaped photonic crystal is emitted in the direction perpendicular to the plate of the base body, to be extracted through the window of the second electrode to the outside.

The laser light has a halo-shaped cross section corresponding to the shape of the ring-shaped photonic crystal. Accordingly, it is possible to decrease the difference between the inner and outer diameters of the halo on the cross section of the beam, i.e. to reduce the width of the halo, by decreasing the difference between the inner and outer diameters of the ring-shaped photonic crystal. Since each modified refractive index area is asymmetrically shaped with respect to the axis extending through the center thereof in the radial direction of the ring, the polarization of the laser beam will be in the radial direction along this axis. Thus, the photonic crystal laser according to the present invention produces a radially-polarized halo-shaped laser beam.

A ring-shaped electrode whose diameter and width overlap those of the ring-shaped photonic crystal is preferable as the first electrode. By this design, the light generated within the active layer can be efficiently introduced into the ring-shaped photonic crystal since electric current is intensively injected into a region of the active layer near the ring of the ring-shaped photonic crystal. In this case, a current-narrowing portion having a current-passing area being identical in shape to the ring-shaped electrode and an insulating area covering the areas around the current-passing area may preferably be provided between the ring-shaped electrode and the ring-shaped photonic crystal. By this design, the electric current can be more intensively injected into the aforementioned region of the active layer.

In the photonic crystal laser according to the present invention, a ring-shaped groove may be provided on each of the inner and outer sides of the ring-shaped photonic crystal. These grooves also contribute to the intensive injection of electric current into the region near the ring of the ring-shaped photonic crystal.

A ring-shaped convex lens bulging in the direction from the ring-shaped photonic crystal toward the second electrode may be provided at the window of the second electrode. This lens has the effect of reducing the width of the halo on the cross section of the laser light.

One example of the window provided in the second electrode is a plate-shaped member made of a material of the electrode with a central portion cut out. In this case, the cut-out area serves as the window, and the remaining portion of the electrode material serves as the second electrode. It is also possible to make the second electrode of a material transparent to the generated laser light, in which case the entirety of the second electrode serves as the window.

The width of the modified refractive index area on the outer circumference of the ring-shaped photonic crystal (which is hereinafter referred to as the "outer circumferential width") may be different from the width of the modified refractive index area on the inner circumference of the ring-shaped photonic crystal ("inner circumferential width").

In this case, the intensity of the laser beam at a cross section will be as follows: When the permittivity of the modified refractive index areas is lower than that of the base body (e.g. when the modified refractive index areas are air holes), the emission of the laser beam at a cross section on the outer circumference will be stronger if the outer circumferential width is smaller than the inner circumferential width, whereas the emission on the inner circumference will be stronger if the outer circumferential width is larger than $(r_2^2/r_1^2)$ times the inner circumferential width (where $r_1$ and $r_2$ are respectively the inner and outer diameters of the ring-shaped photonic crystal). These patterns will be reversed when the permittivity of the modified refractive index areas is higher than that of the base body. Additionally, when the outer circumferential width is larger than the inner circumferential width and smaller than $(r_2^2/r_1^2)$ times the latter width, the intensity of light at the cross section of the laser beam will be closer to the state of uniformity than when the outer circumferential width is equal to the inner circumferential width, regardless of whether the permittivity of the modified refractive index areas is higher or lower than that of the base body. The reason will be hereinafter explained.

The explanation initially concerns the case where the permittivity of the modified refractive index areas is lower than that of the base body. If the outer circumferential width is equal to the inner circumferential width, the density of the modified refractive index areas (filing factor: the ratio of the area occupied by the modified refractive index areas in the photonic crystal) on the outer circumference of the ring is $(r_1/r_2)$ times the density on the inner circumference. This means that the density of the modified refractive index areas is lower on the outer circumference than on the inner circumference. Accordingly, the effective permittivity is higher on the outer circumference of the ring-shaped photonic crystal than on the inner circumference thereof. The electric field of the light introduced into the ring-shaped photonic crystal is likely to be concentrated on the region having a higher effective permittivity within the crystal. Therefore, if the effective permittivity is distributed in the previously described form, the emission of the laser light at a cross section will be stronger on the outer region of the ring than on the inner region. Accordingly, if the outer circumferential width is made to be larger than the inner circumferential width and smaller than $(r_2^2/r_1^2)$ times the latter width, the distribution of the effective permittivity will be closer to the state of uniformity than when the outer circumferential width is equal to the inner circumferential width, so that the intensity of light at the cross section of the laser light will also be closer to the state of uniformity. By contrast, if the outer circumferential width is smaller than the inner circumferential width, the effective permittivity on the outer circumference will be even higher, causing the emission of the laser light at the cross section to be even stronger on the outer region of the ring. If the outer circumferential width is larger than $(r_2^2/r_1^2)$ times the inner circumferential width, the effective permittivity will be higher on the inner circumference of the ring-shaped photonic crystal than on the outer circumference thereof, so that the emission of the laser light at the cross section will be stronger on the outer region of the ring than on the inner region thereof.

In the case where the permittivity of the modified refractive index areas is higher than that of the base body, the relationship in the magnitude of the effective permittivity will be opposite to the previously described case, so that the relationship in the magnitude of the intensity of light at the cross section of the laser light will also be opposite.

If the outer circumferential width is $(r_2/r_1)$ times the inner circumferential width, the density of the modified refractive index areas on the inner circumference of the ring-shaped photonic crystal will be equal to the density on the outer circumference, so that the intensity of light at the cross section of the laser light will be closest to the state of uniformity.

Each of the modified refractive index areas may be composed of a main modified refractive index area and a sub modified refractive index area separated from the main modified refractive index area by a predetermined distance in the circumferential direction of the ring, the sub modified refractive index area having a refractive index different from that of the base body and differing from the main modified refractive index area at least in term of area, shape or refractive index.

When such a sub modified refractive index area is used, interference of the light reflected (diffracted) by the main modified refractive index area (main reflection) and the light reflected (diffracted) by the sub modified refractive index area (sub reflection) occurs in the ring-shaped photonic crystal. This interference causes the light to strengthen or weaken depending on the distance δ between the main modified refractive index area and the sub modified refractive index area. In order to strengthen the laser light, the distance δ can be set so that the main and sub reflections will constructively interfere with each other.

However, if the intensity of the diffracted light per unit length (optical coupling coefficient κ) within the photonic crystal (resonator) increases, the emission is likely to intensively occur at a portion of the photonic crystal. Photonic crystal lasers are one type of one-dimensional distributed feedback lasers, and it is known that this phenomenon generally occurs in one-dimensional distributed feedback lasers (Non-Patent Document 4). This leads to a difference in the intensity of light at the cross section of the laser light. A constructive interference of the main and sub reflections further increases this difference in the intensity of the obtained light, making it impossible to obtain a laser light having a halo-shaped cross section with a uniform intensity distribution. Accordingly, to obtain a laser light having a halo-shaped cross section with an approximately uniform intensity distribution, the distance δ can be appropriately set so that the main and sub reflections destructively interfere with each other. More specifically, the distance δ should preferably be one fourth of the cycle distance of the modified refractive index areas.

Effect of the Invention

By the present invention, it is possible to obtain a photonic crystal laser which oscillates a radially-polarized halo-shaped laser beam having a halo-shaped cross section and being polarized in the radial direction of the halo. The width of the halo of the laser beam can be decreased by reducing the width of the ring-shaped photonic crystal, whereby a radially-polarized halo-shaped laser beam having a smaller width than that of the conventional beam can be obtained. A device obtained by combining the present photonic crystal laser with a lens for focusing the obtained laser beam can be used as a light source capable of producing a beam having a small spot size and z-polarization, the small spot size and z-polarization being created over a wide range on the beam axis. Such a light source can suitably be used in fluorescence microscopes, Raman spectrometers or other measurement devices.

BRIEF DESCRIPTION OF THE DRAWINGS

FIG. 1A is a vertical sectional view of a photonic crystal laser according to one embodiment of the present invention, FIG. 1B is a plan view of the ring-shaped photonic crystal, FIG. 1C is a plan view of the first electrode, and FIG. 1D is a plan view of the second electrode.

FIG. 2 is a partially enlarged view of the ring-shaped photonic crystal in the photonic crystal laser of the present embodiment.

FIGS. 6A-6C are plan views showing examples of the modified refractive index areas arranged at varying intervals in the radial direction.

FIGS. 7A-7C are plan views showing examples of the modified refractive index areas arranged at varying intervals in the radial direction and with changing shapes.

FIGS. 8A-8C are plan views showing examples of the modified refractive index areas arranged in the radial direction at intervals different from the intervals in the circumferential direction.

FIGS. 9A-9H are plan views showing examples of the modified refractive index areas each of which has a shape created by combining one of the shapes of FIGS. 5A-8C with a thin rectangle extending in the radial direction.

FIGS. 12A and 12B are a near-field image and far-field image of a laser beam produced by the photonic crystal laser created in the present embodiment.

FIGS. 13A-13D are photographs showing the result of a measurement of the polarizing direction of a laser beam produced by the photonic crystal laser created in the present embodiment.

FIG. 20 is a plan view showing other examples of the modified refractive index area composed of a main modified refractive index area and a sub modified refractive index area.

FIG. 21A is a sectional view of a radially-polarized halo-shaped laser beam at a plane perpendicular to the beam, and FIG. 21B is a sectional view of the same beam parallel to the beam.

BEST MODE FOR CARRYING OUT THE INVENTION

Figure 3:
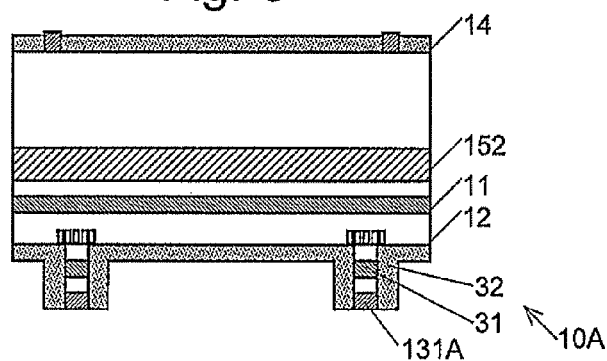
FIG. 3 is a vertical sectional view of one example of the photonic crystal laser of the present embodiment provided with a current-narrowing portion.

Embodiments of the photonic crystal laser according to the present invention are hereinafter described by means of FIGS. 1A-20.

Embodiments

As shown in FIG. 1A, the photonic crystal laser 10 according to the present embodiment includes an active layer 11, a photonic crystal layer 12 provided on one side of the active layer 11, as well as a lower electrode (first electrode) layer 13 and an upper electrode (second electrode) layer 14 facing each other across the first two layers. In the present case, the lower electrode layer 13 is provided on the side facing the photonic crystal layer 12, while the upper electrode layer 14 is provided on the side facing the active layer 11. It is also possible to provide the upper electrode layer 14 on the side facing the photonic crystal 12 and the lower electrode layer 13 on the side facing the active layer 11.

The active layer 11 may be any type of active layer commonly used in conventional semiconductor lasers. In the present embodiment, a material having a multiple-quantum well (MQW) made of Indium Gallium Arsenic (InGaAs)/Gallium Arsenic (GaAs) is used as the material of the active layer 11. This active layer emits light within a wavelength range from 0.9 to 1.1 μm (infrared region). The materials available for the active layer are not limited to the aforementioned one; the material can be appropriately selected according to the wavelength of the laser beam to be generated. For example, a material suitable for a blue laser is a semiconductor having a multiple-quantum well made of Indium Gallium Nitride (InGaN)/Gallium Nitride (GaN), which emits light within a wavelength range from 0.4 to 0.6 μm.

As shown in FIG. 1B, the photonic crystal layer 12 consists of a plate-shaped base body 121 in which air holes (modified refractive index areas) 122 are periodically arranged in the form of a ring. The ring-shaped area with the air holes 122 arranged therein is hereinafter referred to as the "ring-shaped photonic crystal 123." The use of air holes as the modified refractive index areas is advantageous in that it merely requires the easy machine work of boring holes in the base body. Alternatively, a solid member having a refractive index different from that of the material of the base body may be embedded as the modified refractive index area. Embedding a member different from the base body is advantageous in that the modified refractive index area will be less likely to be deformed than in the case of using the air hole. In the present embodiment, p-type GaAs is used as the material of the base body 121. The radius of the ring is 160 μm. The distance between the neighboring air holes is 296 nm, which corresponds to the wavelength of light in the medium. If the active layer is made of InGaN/GaN, a GaN-type material should be used as the material of the base body 121, with the distance between the neighboring air holes being set at 186 nm, which corresponds to the wavelength of light in the medium. A first ring-shaped groove 1241 is provided on the outside of the ring-shaped photonic crystal 123, while a second ring-shaped groove 1242 is provided on the inside of the ring-shaped photonic crystal 123.

The planer shape of the air holes 122 is hereinafter described by means of FIG. 2. Each of the air holes 122 is asymmetrically shaped with respect to a radial axis 129 passing through the center of the hole and extends in the radial direction of the ring. Accordingly, if the air holes 122 are virtually rotated around the center O of the ring of the ring-shaped photonic crystal 123, each air hole 122 will overlap another air hole 122. The reason for shaping the air holes 122 in this way will be described later.

The lower electrode layer 13 consists of a ring-shaped lower electrode (first electrode) 131 made of an electrically conductive material and a first insulating film 132 inside and outside the ring. This ring of the lower electrode 131 has approximately the same diameter as the ring-shaped photonic crystal 123.

The upper electrode layer 14 consists of an upper electrode (second electrode) 141, which is made of an electrically conductive material and shaped like a square frame, and a second insulating film 142 inside and outside the upper electrode 141. The second insulating film is made of SiN and transparent to the light within a wavelength range including 980 to 990 nm. Accordingly, the area inside upper electrode 141 functions as a window 143.

A p-type cladding layer 151 made of a p-type semiconductor is provided between the photonic crystal layer 12 and the lower electrode layer 13, while an n-type cladding layer 152 made of an n-type semiconductor is provided between the active layer 11 and the upper electrode layer 14. These cladding layers are also used in conventional photonic crystal lasers. Additionally, a spacer layer may be inserted between each neighboring pair of the previously mentioned layers.

An operation of the photonic crystal laser 10 of the present embodiment is hereinafter described. An electric current is injected into the active layer 11 by applying a voltage between the upper and lower electrodes 131 and 141. As a result, light is emitted from the active layer 11 within a wavelength range determined by the kind of material of this layer. The emitted light is introduced into the ring-shaped photonic crystal 123. Since the lower electrode 131 is a ring having approximately the same diameter as the ring-shaped photonic crystal 123, the electric current injected into the active layer 11 in the previously described manner is concentrated into a region immediately above the ring-shaped photonic crystal 123, causing a stronger emission of light in that region than in the surrounding areas, so that the generated light will efficiently enter the ring-shaped photonic crystal 123.

Within the ring-shaped photonic crystal 123, a portion of the introduced light having a specific wavelength determined by the cycle distance of the air holes 122 is selectively amplified due to interference, causing a laser oscillation. The generated laser light is emitted in the direction perpendicular to the photonic crystal layer 12, and a laser beam is extracted through the window 143 of the upper electrode 141 to the outside. As shown in FIGS. 21A and 21B, the laser beam 21 has a halo-shaped cross section corresponding to the shape of the ring-shaped photonic crystal 123 and is polarized in the radial direction on the halo-shaped cross section (as shown by the arrows in FIGS. 21A and 21B). The reason for such polarization is as follows: For each air hole 122, an oscillating electric field is created around the air hole 122 along the boundary between this air hole 122 and the base body 121. Since the air hole 122 is asymmetrically shaped with respect to the radial axis 129, it has different values of effective permittivity on the two sides of the radial axis 129, and accordingly, has different values of intensity of the oscillating electric field. Therefore, the electric field oscillating in the radial direction cannot be completely cancelled out between the two neighboring air holes 122 (FIG. 2), so that the laser beam has radial polarization at a cross section thereof.

Variations of the photonic crystal laser 10 of the present embodiment are hereinafter described. The photonic crystal laser 10A shown in FIG. 3 has a current-passing portion 31, which has the same shape as the ring-shaped lower electrode 131A and is located directly under the ring-shaped photonic crystal 123, as well as an insulating film 32 covering the areas surrounding the current-passing portion 31. The structural elements located on the side closer to the upper electrode 141 from the ring-shaped photonic crystal 123 are the same as those of the previously described photonic crystal laser 10. The provision of the current-passing portion 31 has the effect of narrowing the channel of the electric current between the lower electrode 131A and the ring-shaped photonic crystal 123, so that the electric current can be efficiently supplied into the region of the active layer 11 directly above the two-dimensional photonic crystal 123.

Figure 4A:
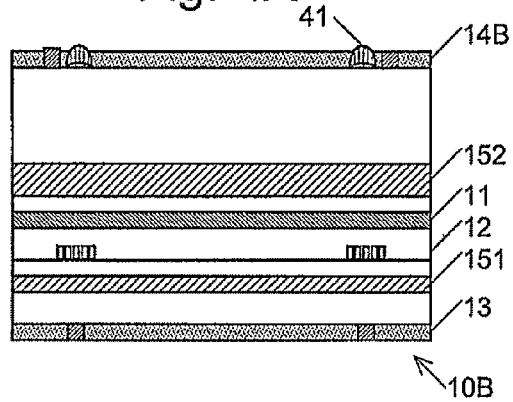
FIGS. 4A and 4B are a vertical view and plan view of one example of the photonic crystal laser of the present embodiment provided with a ring-shaped lens.
Figure 4B:
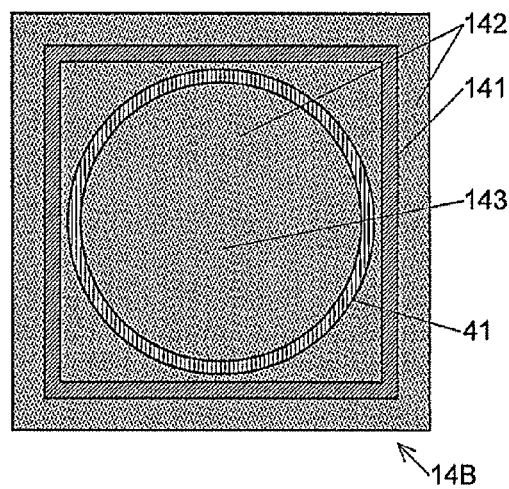

The photonic crystal laser 10B shown in FIGS. 4A and 4B has a ring-shaped lens 41 located directly above the ring-shaped photonic crystal 123 within the area of the window 143. The ring-shaped lens 41 is a convex lens bulging in the direction from the ring-shaped photonic crystal 123 toward the upper electrode layer 14B. The ring-shaped lens 41 has the effect of decreasing the width of the halo at the cross section of the laser beam emitted from the ring-shaped photonic crystal 123.

Subsequently, examples of the shapes of the modified refractive index areas (which are either air holes or members whose refractive index differ from that of the base body) that can be used in any of the previous embodiments are described by means of FIGS. 5A-9H. In any of these figures, the shaded areas represent the modified refractive index areas. The horizontal direction in the figures corresponds to the radial direction of the ring-shaped photonic crystal 123, while the vertical direction corresponds to the circumferential direction. In any of these examples, the modified refractive index areas are equally spaced in the circumferential direction with cycle distance α.

Figure 5A:
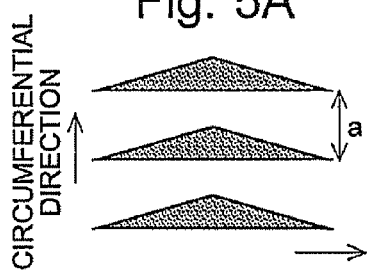
FIGS. 5A-5C are plan views showing examples of the modified refractive index areas in the ring-shaped photonic crystal in the photonic crystal laser of the present embodiment.
Figure 5B:
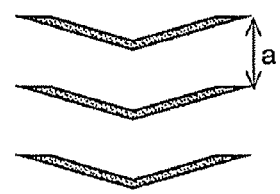
Figure 5C:
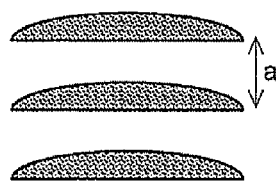

The example shown in FIG. 5A is a triangular area with one side extending parallel to the radial direction. The example shown in FIG. 5B is a V-shaped area with its lateral direction corresponding to the radial direction. The example shown in FIG. 5C is a semielliptical area with the chord extending parallel to the radial direction. Any of these examples is asymmetrically shaped with respect to the radial axis. The triangular example, which is an isosceles triangle in FIG. 5A, may be changed to an equilateral triangle or a triangle with three sides having different lengths. The semielliptical example shown in FIG. 5C may be changed to a semicircular shape.

In any of the examples shown in FIGS. 6A-8C, a plurality of modified refractive index areas of the same kind of shape are arranged not only in the circumferential direction but also in the radial direction. In the examples shown in FIGS. 6A-6C, the modified refractive index areas are arranged at varying intervals in the radial direction and at equal intervals in the circumferential direction. In the examples shown in FIG. 7A-7C, the modified refractive index areas not only change their spatial intervals but also vary in shape in the radial direction, while they have the same shape and spatial interval in the circumferential direction. In the examples shown in FIG. 8A-8C, the modified refractive index areas are equally spaced in the radial direction at regular intervals which differ from the intervals in the circumferential direction. In any of the examples of FIGS. 6A-8C, each individual modified refractive index area may have a triangular, semicircular (semielliptical), V-shaped or any other from. From the viewpoint of the periodic structure of the ring-shaped photonic crystal, each row of the modified refractive index areas arranged in the radial direction functions as one modified refractive index area.

In the examples of FIGS. 6A-8C, since there is no periodicity in the radial direction, or at least since there is a difference in cycle distance between the radial and circumferential directions, a one-dimensional distribution of the refractive index in the circumferential direction is created, so that a single-mode laser oscillation can be easily obtained. It is also possible to use the same cycle distance in both the circumferential and radial directions, although it may result in a multi-mode oscillation.

Each of the modified refractive index areas shown in FIGS. 9A-9H has a shape created by combining one of the shapes shown in FIGS. 5A-8C with a thin rectangle extending in the radial direction. The presence of the rectangle further increases the degree of asymmetry with respect to the radial axis.

Figure 10A:
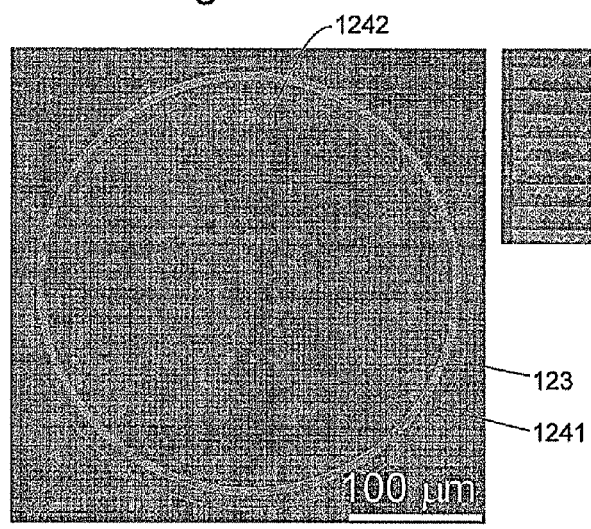
FIG. 10A is an electron microscope image of a ring-shaped photonic crystal in a photonic crystal laser created in the present embodiment.
Figure 10B:
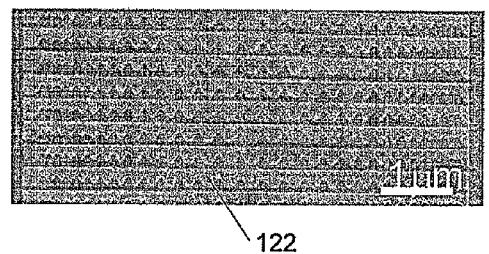
FIG. 10B is an electron microscope image showing an enlarged view of the modified refractive index areas.

An actual version of the photonic crystal laser 10 was experimentally created to confirm its laser-oscillation capability. The result of this experiment is hereinafter described. The electron microscope image in FIG. 10A shows the presence of a ring-shaped photonic crystal 123, a first groove 1241 and a second groove 1242 in the created photonic crystal laser 10. The enlarged image in FIG. 10B shows air holes 122.

Figure 11:
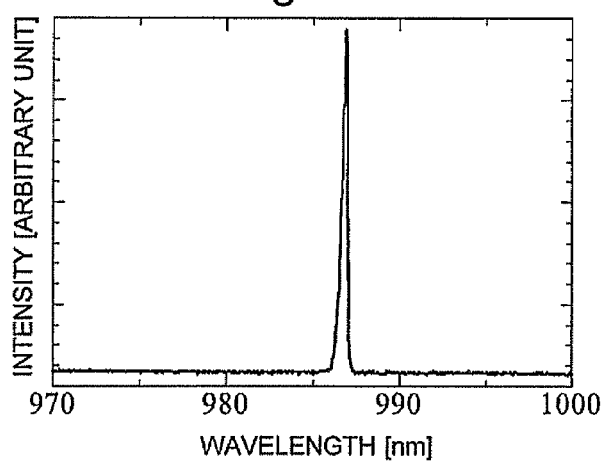
FIG. 11 is a graph showing an oscillation spectrum of the photonic crystal laser created in the present embodiment.
Figure 14:
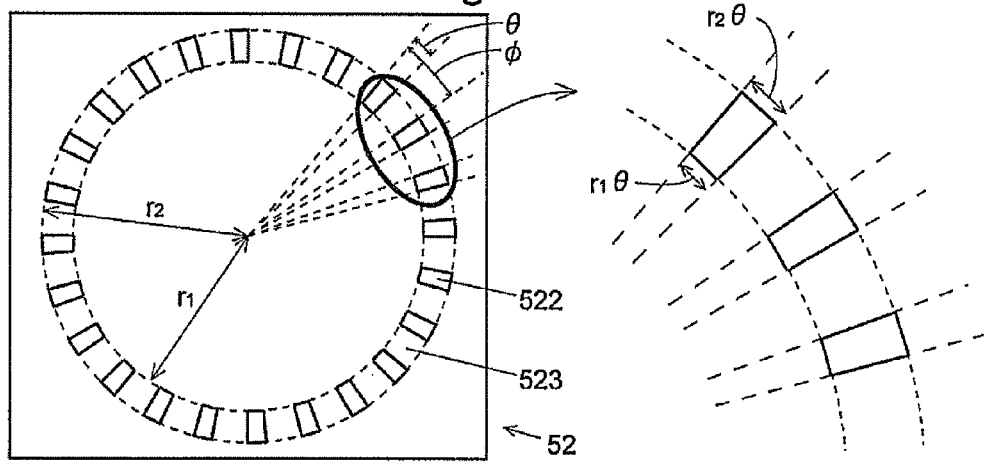
FIG. 14 is a plan view showing one example of the modified refractive index area with the inner and outer circumferential widths differing from each other.

It was confirmed that a single-wavelength laser beam of approximately 987 nm was generated from the created photonic crystal laser 10, as shown in FIG. 11. The laser beam had a halo-shaped cross section as shown by the near-field image in FIG. 12A. A far-field image of the beam was a Fourier-transform image of the halo-shaped near-field image (FIG. 12B). Additionally, to ascertain the polarization of the laser beam, a polarizer was placed perpendicularly to the laser beam, and far-field images of the laser beam passing through the polarizer were taken while rotating the polarizer on an axis perpendicular to the polarizer. FIGS. 13A-13D show the taken images, each of which demonstrates that, regardless of the orientation of the polarizer, the laser beam was detected only in specific areas corresponding to the oscillating direction of the electric field (as indicated by the arrows in FIGS. 13A-13D) that was allowed to pass through the polarizer. This means that the laser beam was polarized in the radial direction.

With reference to FIGS. 14A-15D, examples of the devices using a ring-shaped photonic crystal layer 52 having air holes (modified refractive index areas) with different inner and outer circumferential widths are hereinafter described. In the example shown in FIGS. 14A and 14B, each of the air holes 522 is in the form of a closed area defined with two half lines extending in the radial direction from the center of the ring-shaped photonic crystal 523 and with the inner and outer circumferences of the ring. These areas are arranged along the circumference of the ring-shaped photonic crystal 523. With θ denoting the angle made by the two half lines as well as $r_1$ and $r_2$ respectively denoting the inner and outer diameters of the ring, the inner and outer circumferential widths of the air hole 522 are given by $r_1\theta$ and $r_2\theta$, respectively, where $r_1\theta$ is greater than $r_2\theta$. The configurations of the other elements (the configurations of the base body of the photonic crystal layer 52 and the layers other than the photonic crystal layer 52) are the same as those of the photonic crystal laser 10.

Shaping the air holes 522 in the previously described manner makes their filling factor to be θ/φ at any position in the radial direction of the ring-shaped photonic crystal layer 52 (where φ is the angle between one of the two half lines and the corresponding half line of the neighboring air hole). As a result, the effective permittivity within the ring-shaped photonic crystal will be uniform, so that the electric-field distribution of the light will also be uniform. In the case of a rectangular air hole with both the inner and outer circumferential widths being $r_1\theta$, the filling factor on the inner circumference is θ/φ, while the filling factor on the outer circumference is $(r_1/r_2)\times(\theta/\phi)$. Thus, the filling factor on the outer circumference has a smaller value. It should be noted that the filling factor in this paragraph is defined as the ratio of the sections occupied by the air holes on the circumference of a circle having a certain diameter.

Figure 15A:
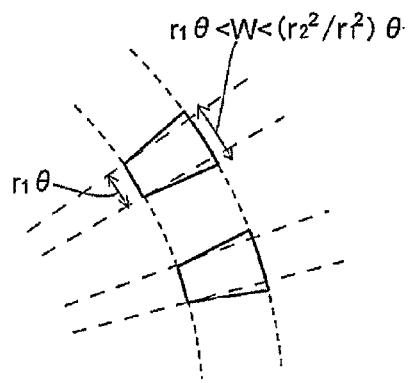
FIGS. 15A-15D are plan views each showing other examples of the modified refractive index areas with the inner and outer circumferential widths differing from each other.
Figure 15B:
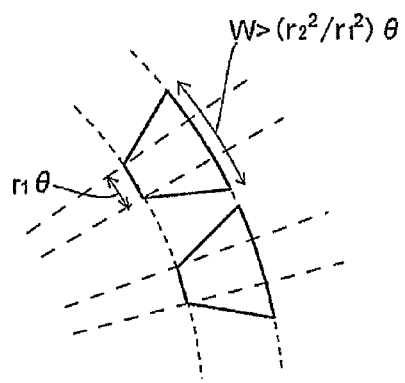
Figure 15C:
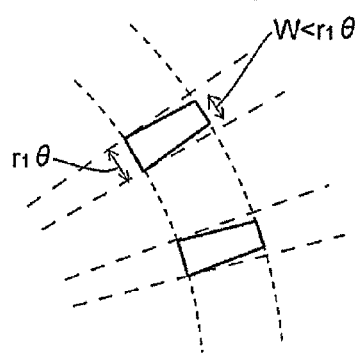
Figure 15D:
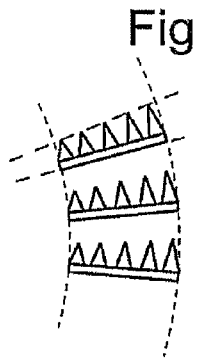
Figure 16:
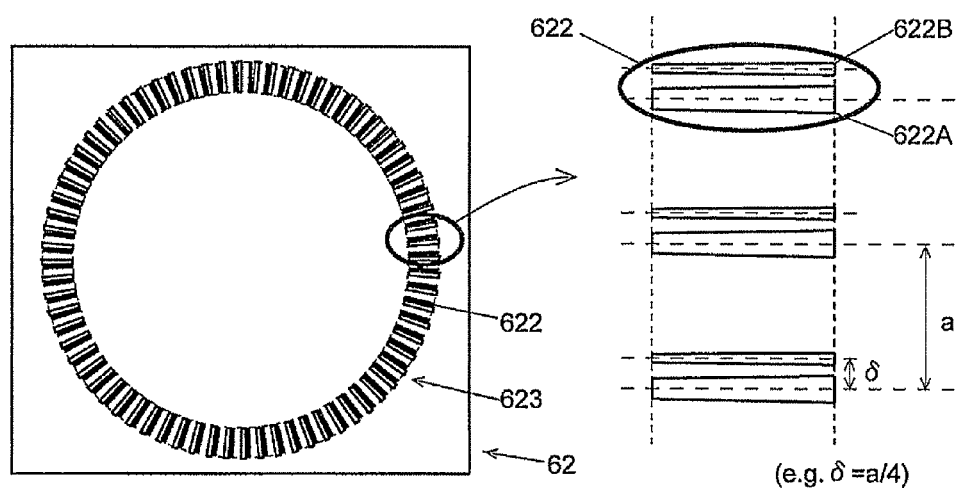
FIG. 16 is a plan view showing one example of the modified refractive index area composed of a main modified refractive index area and a sub modified refractive index area.

In the example of FIGS. 14A and 14B, the filling factor has the same value at any position in the radial direction. If the outer circumferential width is greater than the inner circumferential width and smaller than $(r_2^2/r_1^2)$ times the latter width (e.g. as in FIG. 15A), the variation in the filling factor will be smaller than in the previous case of the rectangular air hole, so that the spatial distribution of the intensity of light will also be smaller. If the outer circumferential width is greater than $(r_2^2/r_1^2)$ times the inner circumferential width (FIG. 15B), the intensity of the laser beam on a cross section will be higher in the inner portion of the halo. If the outer circumferential width is smaller than the inner circumferential width (FIG. 15C), the intensity of light will be higher in the outer portion of the halo. The shape of the air holes is not limited to the previously described ones. For example, the aforementioned air hole 122, which is asymmetrically shaped with respect to the radial axis 129, can be modified so that its inner and outer circumferential widths differ from each other (FIG. 15D). It is also possible to use an air-hole group consisting of a plurality of air holes arranged in the radial direction as shown in FIGS. 5A-9H with the inner and outer circumferential widths differing from each other.

Figure 17:
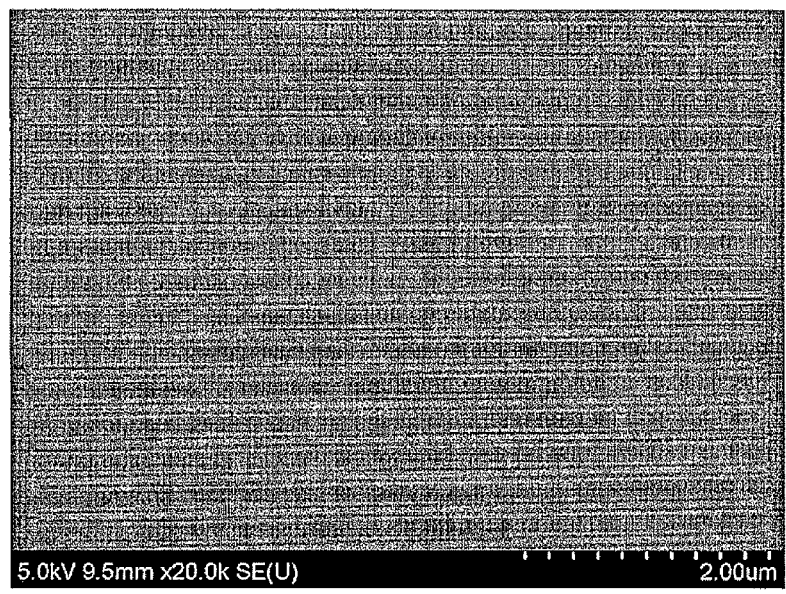
FIG. 17 is an electron microscope image showing a portion of a ring-shaped photonic crystal using a modified refractive index area composed of a main modified refractive index area and a sub modified refractive index area.
Figure 18:
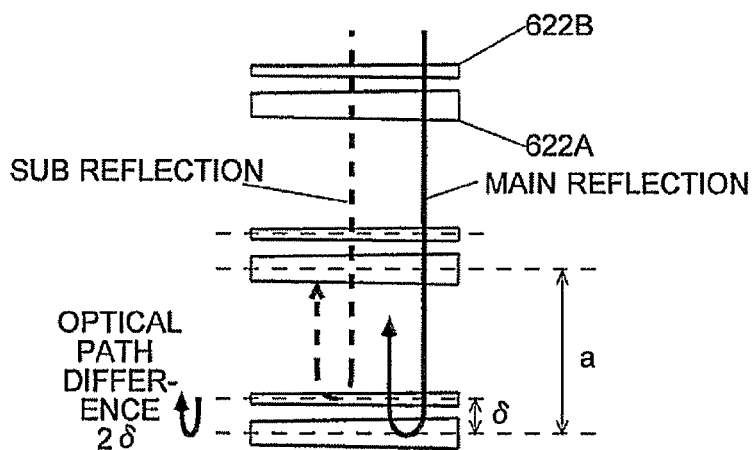
FIG. 18 is a diagram illustrating the interference of light which occurs when the sub modified refractive index area is present.

With reference to FIGS. 16-20, examples of the devices using a ring-shaped photonic crystal 62 having main holes (main modified refractive index areas) and sub holes (sub modified refractive index areas) are hereinafter described. In the example shown in FIG. 16, each air hole 622 consists of a main hole 622A and a sub hole 622B which is smaller in area than the main hole 622A. The main and sub holes are arranged side by side in the circumferential direction of the ring-shaped photonic crystal 623. The distance (cycle distance) between the neighboring air holes 622 is α. The distance between the main hole 622A and the sub hole 622B in each air hole 622 is δ. In the present embodiment, each of the main and sub holes 622A and 622B has a larger outer circumferential width and a smaller inner circumferential width, although it is possible to design these air holes so that their inner circumferential widths are greater than the outer circumferential width, or so that the inner and outer circumferential widths are equal to each other. The configurations of the other elements (the configurations of the base body and the layers other than the photonic crystal layer) are the same as those of the photonic crystal laser 10. FIG. 17 is an electron microscope image showing an enlarged view of the air holes 622 in an actually created sample of the ring-shaped photonic crystal 623.

When the main and sub holes 622A and 622B are provided in the previously described manner, an optical path difference of 2δ for the light propagated in the circumferential direction of the ring-shaped photonic crystal 62 is created between the light reflected by one main hole 622A and the light reflected by the sub hole 622B paired with the aforementioned one main hole 622A in the same air hole 622. These two rays of light either constructively or destructively interfere with each other. Even in the case of the destructive interference, the two rays of light will not be completely cancelled out since the main hole 622A and the sub hole 622B have different areas.

In particular, for a light of wavelength α (i.e. the wavelength equal to the cycle distance of the air holes 622), which is to be amplified by the ring-shaped photonic crystal, the interference occurs in the most destructive form when the distance δ is α/4. This prevents the intensity of light from being locally strengthened on the ring. Thus, a laser light having a halo-shaped cross section with a uniform intensity distribution will be obtained.

Figure 19A:
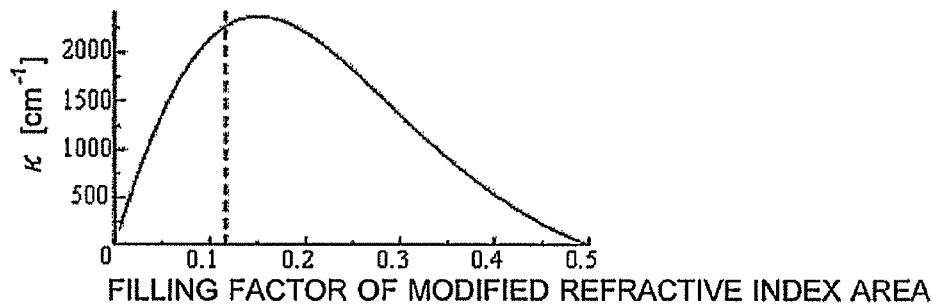
FIGS. 19A and 19B show the result of a calculation of the magnitude of the optical coupling coefficient κ for a device using a modified refractive index area consisting of only the main modified refractive index area (FIG. 19A) and for a device using a modified refractive index area composed of a main modified refractive index area and a sub modified refractive index area (FIG. 19B).
Figure 19B:
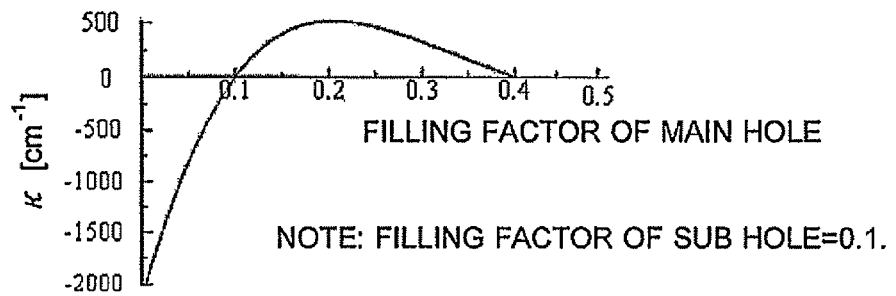

FIGS. 19A and 19B show the result of a calculation of the optical coupling coefficient κ for a device with no sub holes 622B (FIG. 19A) and for a device with the sub holes (FIG. 19B). In this calculation, the value of 6 was set at α/4. The filling factor of the sub holes 622B was fixed at 0.1, while the filling factor of the main holes 622A was changed as a variable of the calculation. It should be noted that the filling factor in this calculation was defined as the ratio of the area of the air holes to the area of the ring-shaped photonic crystal. From the result of this calculation, it can be said that, when the sub hole 622B having an area smaller than the main hole 622A is provided (when the filling factor of the main hole 622A in FIG. 19B is greater than 0.1), the optical coupling coefficient κ becomes smaller than in the case where no sub hole 622B is present, so that the intensity of light is prevented from being locally strengthened on the ring.

The combinations of the main and sub modified refractive index areas are not limited to the previous ones. For example, as shown in FIG. 20, it is possible to use a main hole 622A1 or 622A2 formed by a series of identically shaped air holes arranged in the radial direction (where each of these air holes does not correspond to one complete modified refractive index area but a portion thereof) and a sub hole 622B1 or 622B2 formed by a series of air holes arranged in the radial direction, with the diameter of these air holes being smaller than that of the air holes forming the main hole 622A1. The shape of the main modified refractive index area may be different from that of the sub modified refractive index area (e.g. one of them may be a circle and the other may be a triangle). The main and sub modified refractive index areas may be made of different materials having different refractive indexes (including the case of using an air hole for one of them).

EXPLANATION OF NUMERALS

10, 10A, 10B . . . Photonic Crystal Laser
11 . . . Active Layer
12, 52, 62 . . . Photonic Crystal Layer
121 . . . Base Body
122, 522, 622, . . . Air Hole (Modified Refractive Index Area)
123, 523, 623 . . . Ring-Shaped Photonic Crystal
1241 . . . First Groove
1242 . . . Second Groove
129 . . . Radial Axis
13 . . . Lower Electrode Layer
131, 131A . . . Lower Electrode (First Electrode)
132 . . . First Insulating Film
14, 14B . . . Upper Electrode Layer
141 . . . Upper Electrode (Second Electrode)
142 . . . Second Insulating Film
143 . . . Window
151 . . . p-Type Cladding Layer
152 . . . n-Type Cladding Layer
21 . . . Laser Beam
31 . . . Current-Passing Portion
32 . . . Insulating Film
41 . . . Ring-Shaped Lens
622A, 622A1, 622A2 . . . Main Hole (Main Modified Refractive Index Area)
622B, 622B1, 622B2 . . . Sub Hole (Sub Modified Refractive Index Area)

The invention claimed is:
1. A photonic crystal laser, comprising:
a) an active layer;
b) a ring-shaped photonic crystal including a plate-shaped base body on one side of the active layer, and a ring-shaped area formed in the plate-shaped base body, the ring-shaped area being formed by a plurality of modified refractive index area rows periodically arranged in a circumferential direction of a ring such that rotation symmetry is present, each of the modified refractive index area rows having an effective permittivity asymmetrical with respect to a center line of the modified refractive index area row, and each modified refractive index area in the modified refractive index area rows are arranged in a straight line in a radial direction of the ring, the modified refractive index areas being formed of a single material and having a refractive index different from that of the base body, the ring-shaped photonic-crystal being formed without a central defect;

c) a first electrode and a second electrode facing each other across the active layer and the ring-shaped photonic crystal; and d) a window provided in the second electrode, the window being capable of allowing passage of a laser light generated from the ring-shaped photonic crystal.

2. The photonic crystal laser according to claim 1, wherein the first electrode is a ring-shaped electrode whose diameter and width overlap those of the ring-shaped photonic crystal.

3. The photonic crystal laser according to claim 2, wherein a current-narrowing portion having a current-passing area being identical in shape to the ring-shaped electrode and an insulating area covering areas around the current-passing area are provided between the ring-shaped electrode and the ring-shaped photonic crystal.

4. The photonic crystal laser according to claim 1, comprising a ring-shaped groove on each of inner and outer sides of the ring-shaped photonic crystal.

5. The photonic crystal laser according to claim 1, wherein a ring-shaped convex lens bulging in a direction from the ring-shaped photonic crystal toward the second electrode is provided at the window of the second electrode.

6. The photonic crystal laser according to claim 1, wherein an outer circumferential width, which is a width of the modified refractive index area on an outer circumference of the ring-shaped photonic crystal is different from an inner circumferential width, which is a width of the modified refractive index area on an inner circumference of the ring-shaped photonic crystal.

7. The photonic crystal laser according to claim 6, wherein the outer circumferential width is larger than the inner circumferential width and smaller than $(r_2^2/r_1^2)$ times the inner circumferential width, where $r_1$ is an inner diameter of the ring-shaped photonic crystal and $r_2$ is an outer diameter of the ring-shaped photonic crystal.

8. The photonic crystal laser according to claim 7, wherein the outer circumferential width is $(r_2/r_1)$ times the inner circumferential width.

9. The photonic crystal laser according to claim 1, wherein the one or the plurality of modified refractive index areas in the modified refractive index area row are asymmetrically shaped with respect to the center line of the modified refractive index area row.

10. A photonic crystal laser, comprising:

a) an active layer;

b) a ring-shaped photonic crystal including a plate-shaped base body on one side of the active layer, and a ring-shaped area formed in the plate-shaped base body, the ring-shaped area being formed by a plurality of modified refractive index area rows periodically arranged in a circumferential direction of a ring such that rotation symmetry is present, each of the modified refractive index area rows having an effective permittivity asymmetrical with respect to a center line of the modified refractive index area row, and each modified refractive index area row includes at least two modified refractive index areas offset from each other in a circumferential direction of the ring and at least two modified refractive index areas partially overlapping in the radial direction of the ring, the modified refractive index areas being formed of a single material and having a refractive index different from that of the base body, the at least two modified refractive index areas offset from each other in the circumferential direction having a diameter different from each other;

c) a first electrode and a second electrode facing each other across the active layer and the ring-shaped photonic crystal; and d) a window provided in the second electrode, the window being capable of allowing passage of a laser light generated from the ring-shaped photonic crystal.

11. A photonic crystal laser, comprising:

a) an active layer;

b) a ring-shaped photonic crystal including a plate-shaped base body on one side of the active layer, and a ring-shaped area formed in the plate-shaped base body, the ring-shaped area being formed by a plurality of modified refractive index area rows periodically arranged in a circumferential direction of a ring such that rotation symmetry is present, each of the modified refractive index area rows having an effective permittivity asymmetrical with respect to a center line of the modified refractive index area row, and each modified refractive index area row includes at least two modified refractive index areas offset from each other in a circumferential direction of the ring, the two modified refractive index areas having a refractive index different from that of the base body and having a diameter different from each other;

c) a first electrode and a second electrode facing each other across the active layer and the ring-shaped photonic crystal; and d) a window provided in the second electrode, the window being capable of allowing passage of a laser light generated from the ring-shaped photonic crystal, wherein an amount of the offset is one fourth of a cycle distance of the modified refractive index area rows.

* * * * *